US009659869B2

(12) United States Patent
Jezewski et al.

(10) Patent No.: US 9,659,869 B2
(45) Date of Patent: May 23, 2017

(54) FORMING BARRIER WALLS, CAPPING, OR ALLOYS /COMPOUNDS WITHIN METAL LINES

(71) Applicant: Intel Corporation, Santa Clara, CA (US)

(72) Inventors: Christopher J Jezewski, Hillsboro, OR (US); Alan M Meyers, Beaverton, OR (US); Kanwal Jit Singh, Hillsboro, OR (US); Tejaswi K Indukuri, Hillsboro, OR (US); James S Clarke, Portland, OR (US); Florian Gstrein, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/630,724

(22) Filed: Sep. 28, 2012

(65) Prior Publication Data

US 2014/0091467 A1    Apr. 3, 2014

(51) Int. Cl.
*H01L 23/532* (2006.01)
*H01L 21/768* (2006.01)

(52) U.S. Cl.
CPC .. *H01L 23/53238* (2013.01); *H01L 21/76808* (2013.01); *H01L 21/76843* (2013.01); *H01L 21/76847* (2013.01); *H01L 21/76849* (2013.01); *H01L 21/76883* (2013.01); *H01L 21/76886* (2013.01); *H01L 2924/0002* (2013.01)

(58) Field of Classification Search
CPC ........... H01L 21/2855; H01L 21/28562; H01L 21/76843; H01L 21/76873; H01L 21/76846; H01L 21/76855; H01L 21/76867; H01L 23/53238; H01L 23/5329; H01L 21/44; H01L 21/76883; H01L 21/76849; H01L 21/76808; H01L 21/76847; H01L 21/76886; C25D 5/02
See application file for complete search history.

(56) References Cited

U.S. PATENT DOCUMENTS

| | | | |
|---|---|---|---|
| 5,939,788 A * | 8/1999 | McTeer | H01L 21/76843 257/751 |
| 6,258,707 B1 * | 7/2001 | Uzoh | 438/618 |
| 6,734,559 B1 * | 5/2004 | Yang et al. | 257/751 |
| 6,975,032 B2 * | 12/2005 | Chen et al. | 257/750 |
| 7,190,079 B2 * | 3/2007 | Andricacos et al. | 257/774 |
| 7,915,162 B2 * | 3/2011 | Anderson et al. | 438/653 |
| 8,679,972 B1 * | 3/2014 | Rozbicki et al. | 438/662 |
| 2005/0048768 A1 * | 3/2005 | Inoue et al. | 438/629 |
| 2005/0239288 A1 * | 10/2005 | Peng | H01L 21/76838 438/687 |
| 2006/0199387 A1 * | 9/2006 | Rhodes | 438/687 |
| 2006/0267207 A1 * | 11/2006 | Feustel et al. | 257/774 |
| 2006/0286797 A1 * | 12/2006 | Zhang et al. | 438/659 |
| 2007/0004230 A1 * | 1/2007 | Johnston et al. | 438/785 |

(Continued)

*Primary Examiner* — Jarrett Stark
*Assistant Examiner* — Bitew Dinke
(74) *Attorney, Agent, or Firm* — Forefront IP Lawgroup, PLLC

(57) ABSTRACT

Described herein are techniques structures related to forming barrier walls, capping, or alloys/compounds such as treating copper so that an alloy or compound is formed, to reduce electromigration (EM) and strengthen metal reliability which degrades as the length of the lines increases in integrated circuits.

13 Claims, 21 Drawing Sheets

(56) References Cited

U.S. PATENT DOCUMENTS

| | | | |
|---|---|---|---|
| 2007/0020931 A1* | 1/2007 | Koura et al. | 438/687 |
| 2007/0059925 A1* | 3/2007 | Choi et al. | 438/640 |
| 2007/0128847 A1* | 6/2007 | Hong | 438/624 |
| 2008/0211097 A1* | 9/2008 | Kawahara et al. | 257/751 |
| 2008/0265416 A1* | 10/2008 | Lee et al. | 257/751 |
| 2009/0026625 A1* | 1/2009 | Yang et al. | 257/762 |
| 2009/0079077 A1* | 3/2009 | Yang et al. | 257/751 |
| 2009/0108450 A1* | 4/2009 | Lloyd, Jr. | H01L 23/53238 257/751 |
| 2009/0127711 A1* | 5/2009 | Bonilla et al. | 257/758 |
| 2009/0289368 A1* | 11/2009 | Yang et al. | 257/751 |
| 2009/0298280 A1* | 12/2009 | Yang et al. | 438/637 |
| 2010/0052181 A1* | 3/2010 | Werner et al. | 257/773 |
| 2010/0078820 A1* | 4/2010 | Kurokawa et al. | 257/751 |
| 2010/0084766 A1* | 4/2010 | Yang et al. | 257/763 |
| 2010/0143649 A1* | 6/2010 | Edelstein et al. | 428/138 |
| 2010/0244252 A1* | 9/2010 | Jezewski et al. | 257/751 |
| 2011/0147940 A1* | 6/2011 | Akolkar | 257/762 |
| 2011/0256715 A1* | 10/2011 | Pan et al. | 438/653 |
| 2013/0112462 A1* | 5/2013 | Yang et al. | 174/257 |
| 2014/0061915 A1* | 3/2014 | Collins et al. | 257/751 |
| 2014/0077334 A1* | 3/2014 | Bao et al. | 257/529 |
| 2014/0091467 A1* | 4/2014 | Jezewski et al. | 257/751 |

* cited by examiner

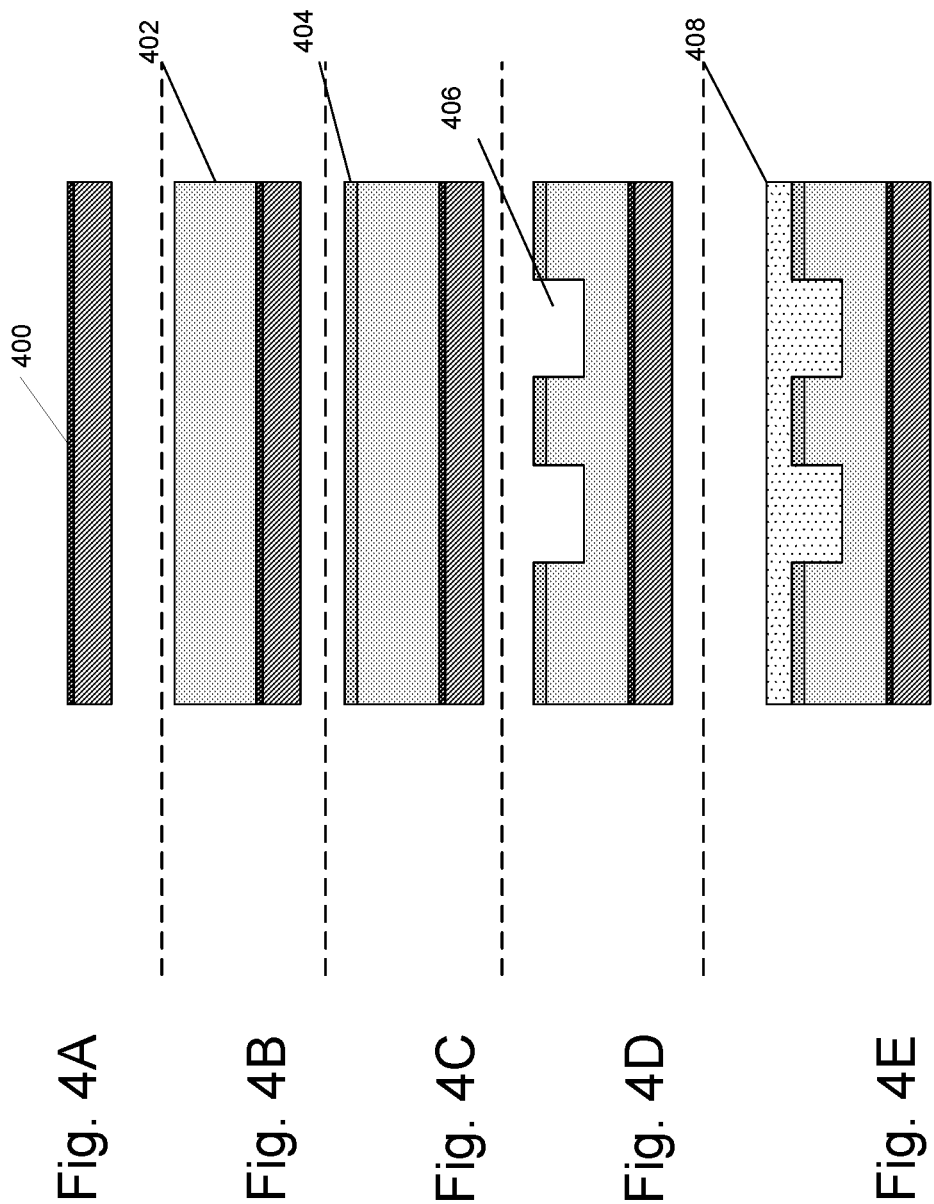

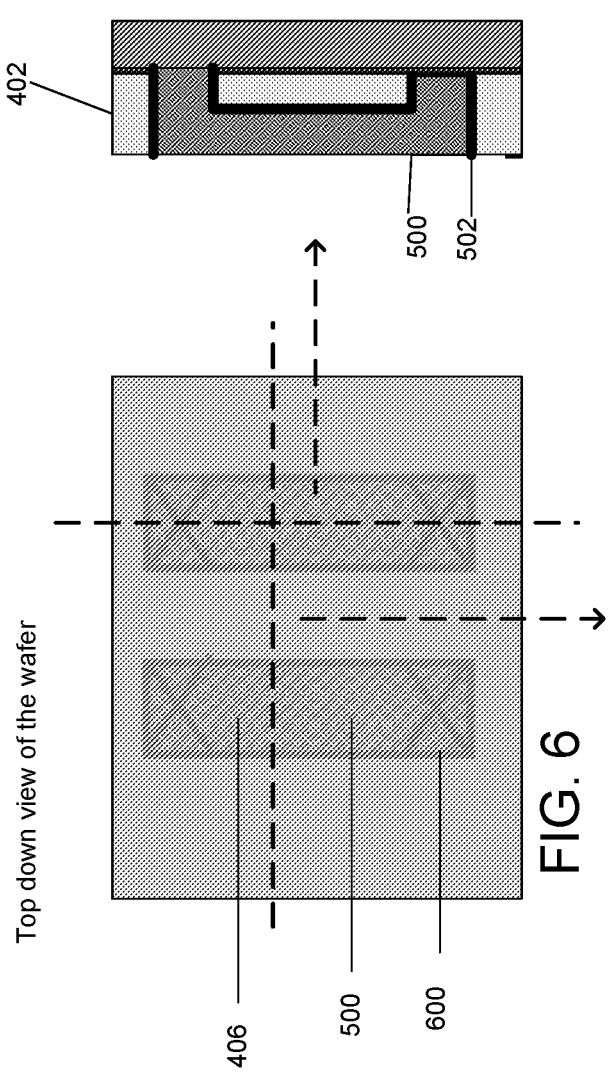
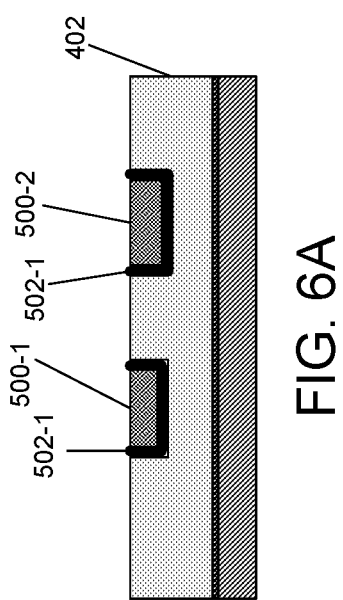
FIG. 6B
FIG. 6
FIG. 6A

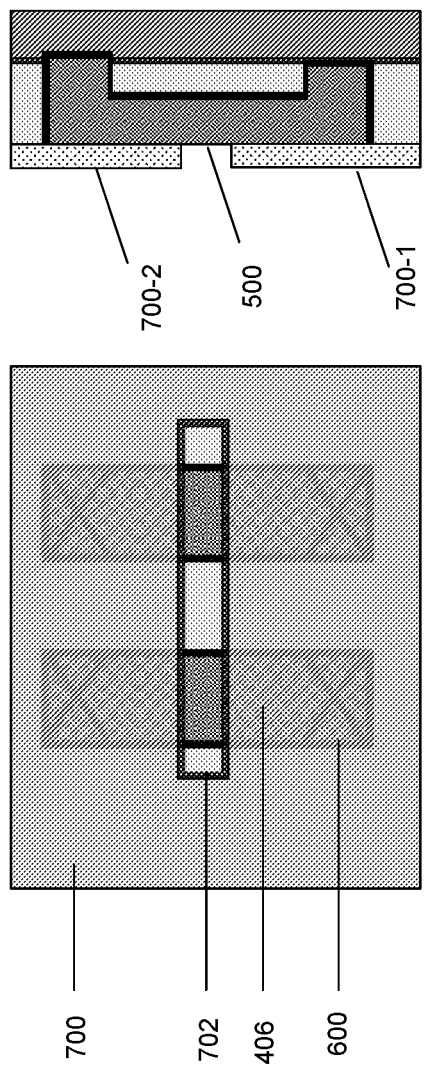
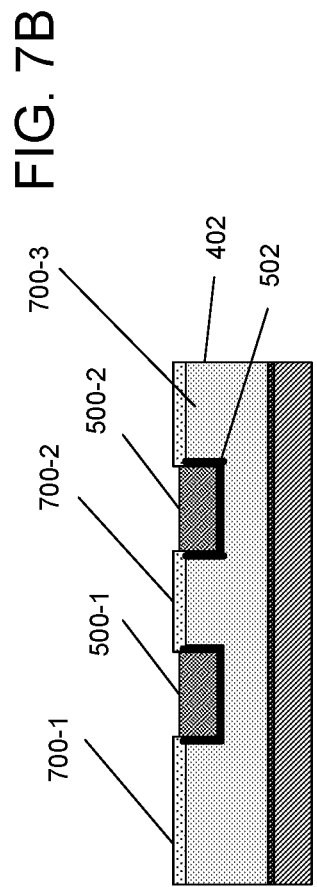
FIG. 7
FIG. 7A
FIG. 7B

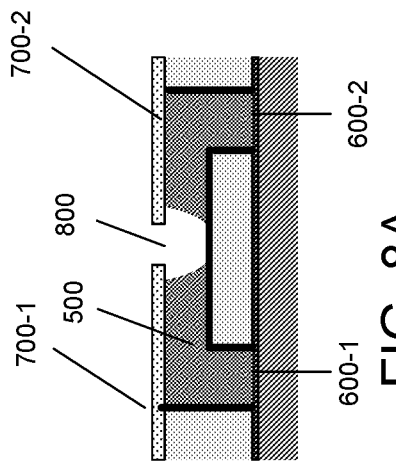
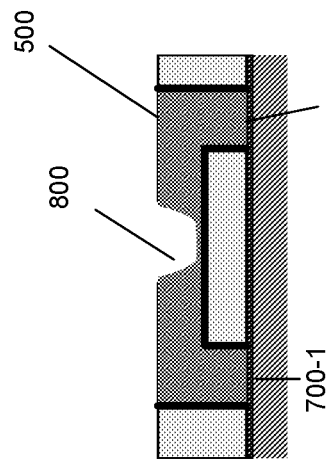
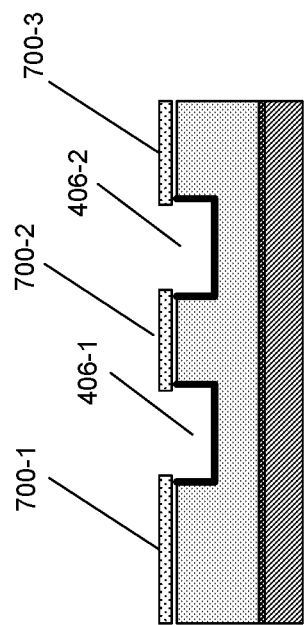
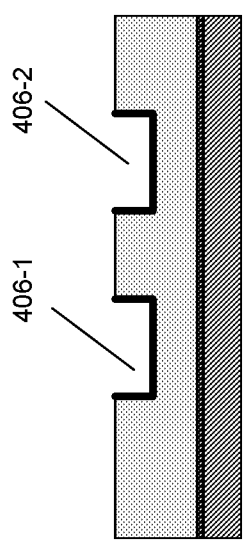
FIG. 8A
FIG. 9A
FIG. 8
FIG. 9

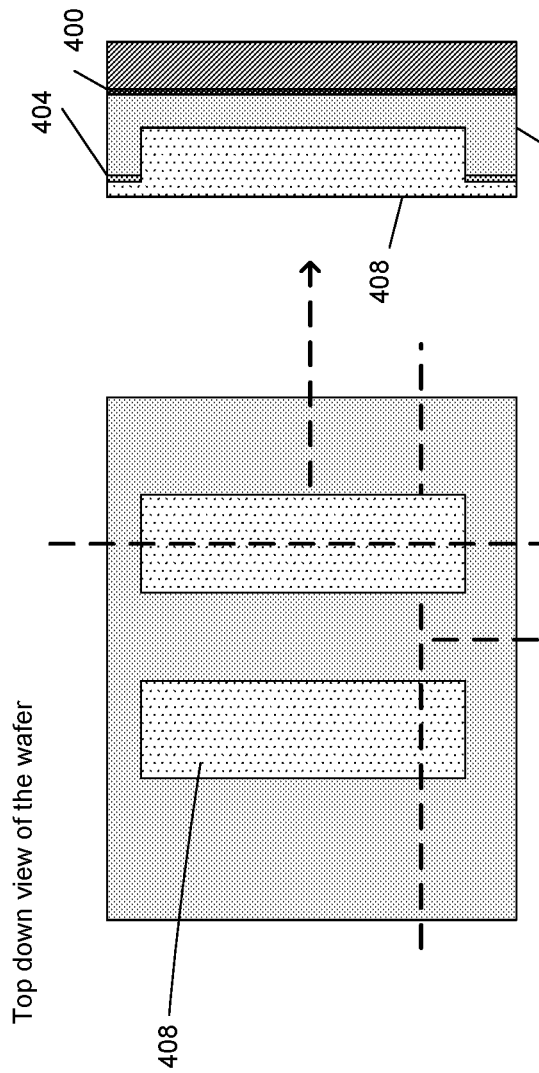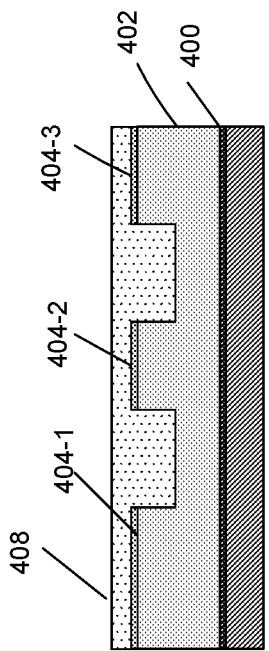

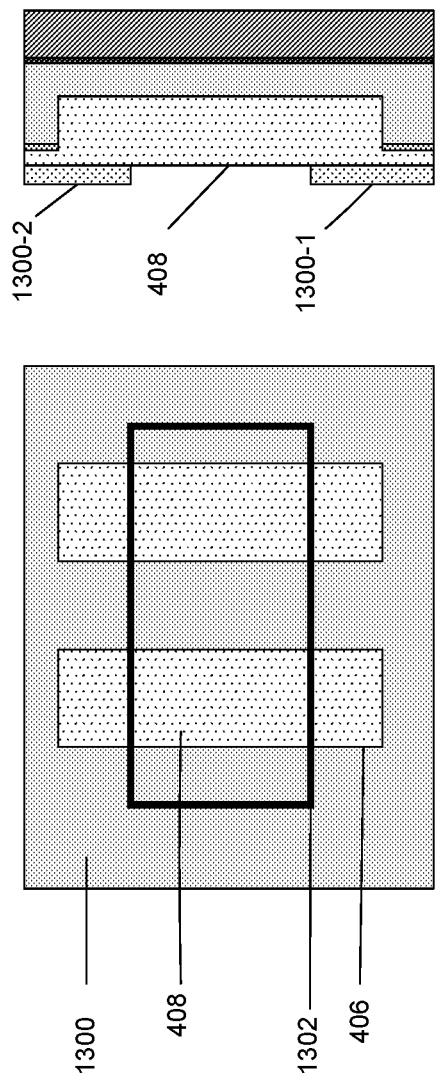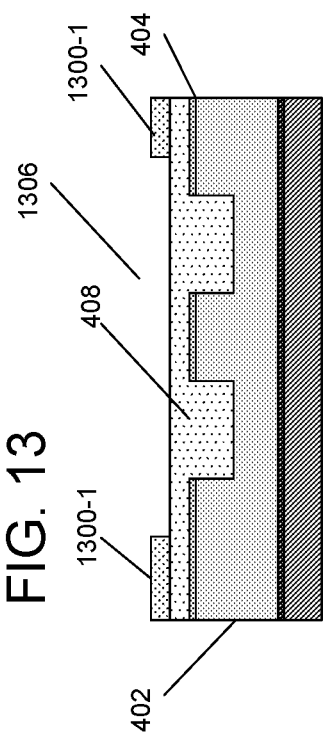
FIG. 13
FIG. 13A
FIG. 13B

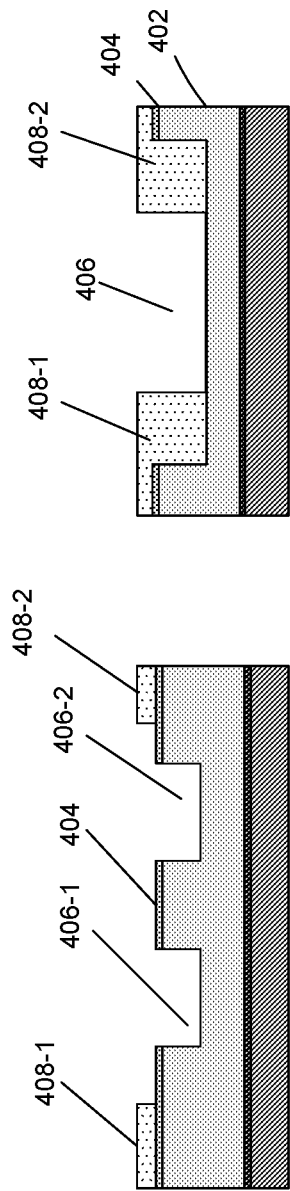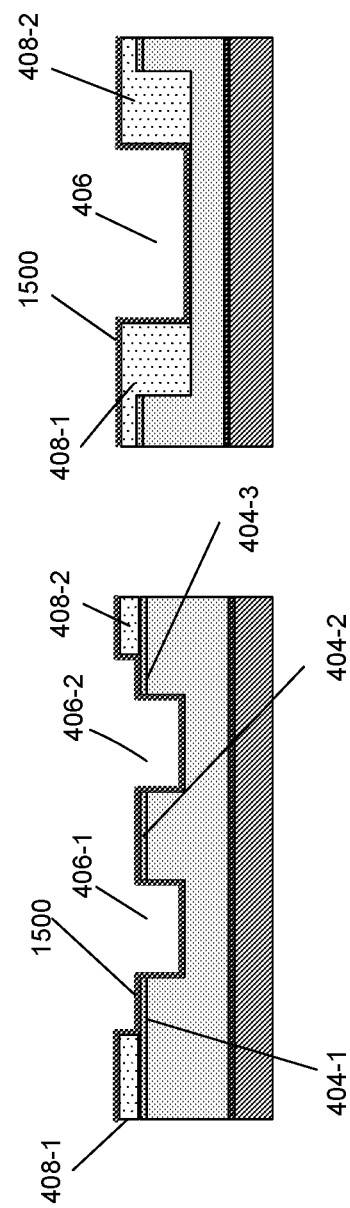

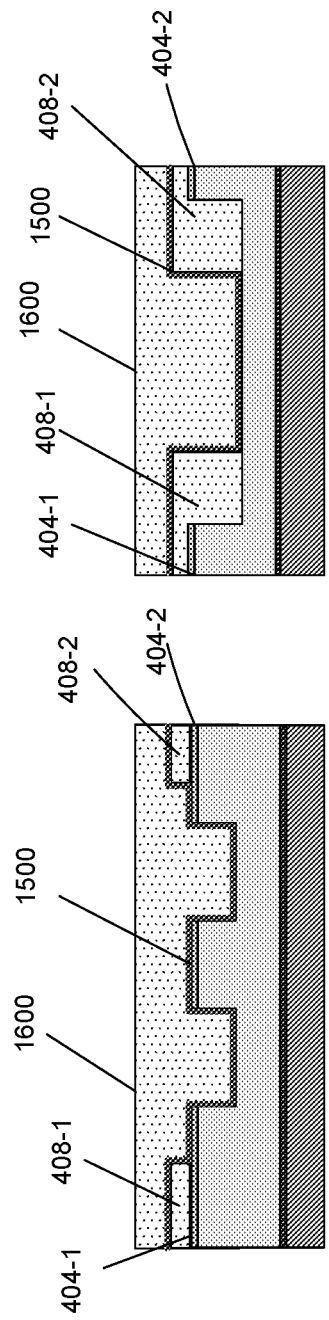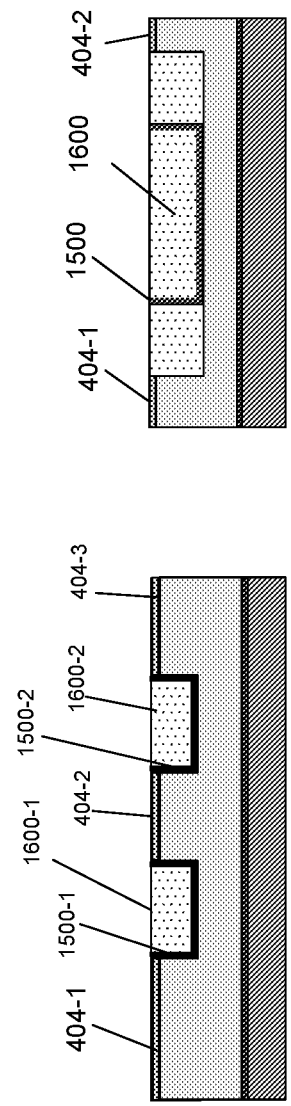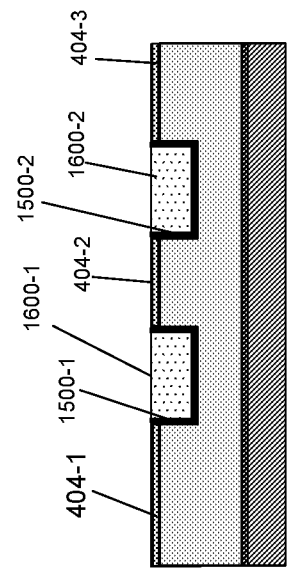

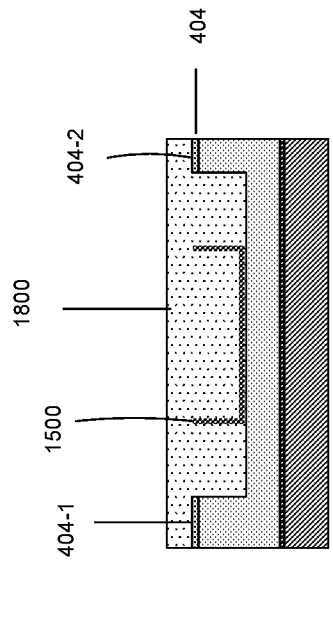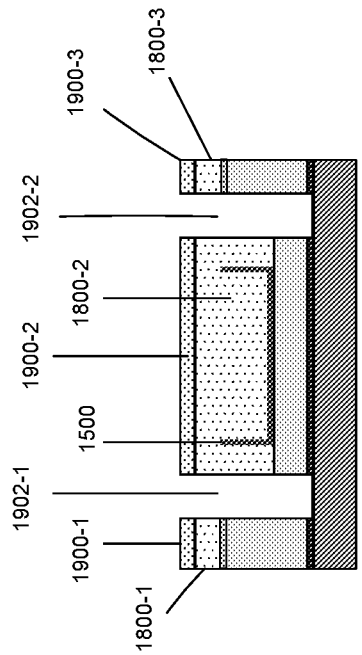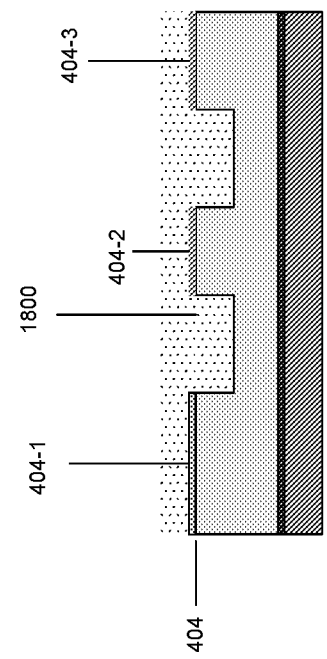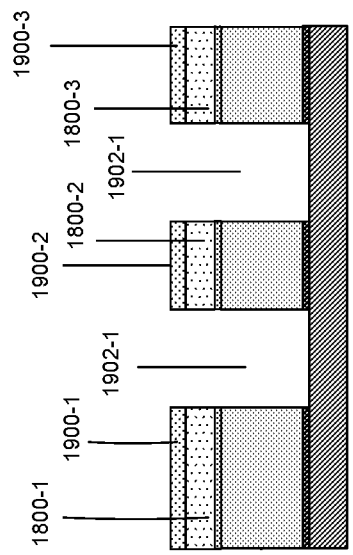

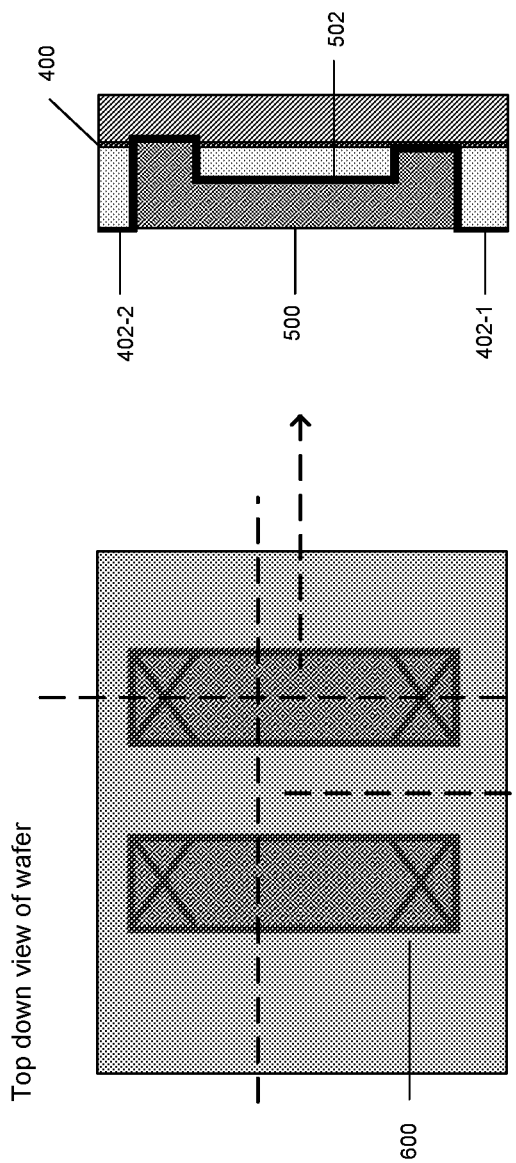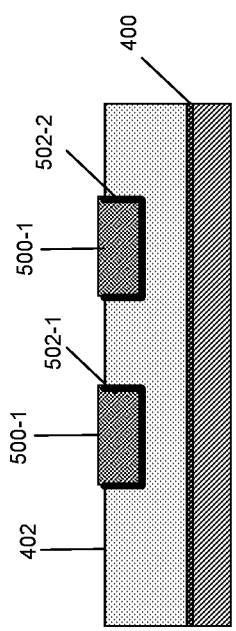

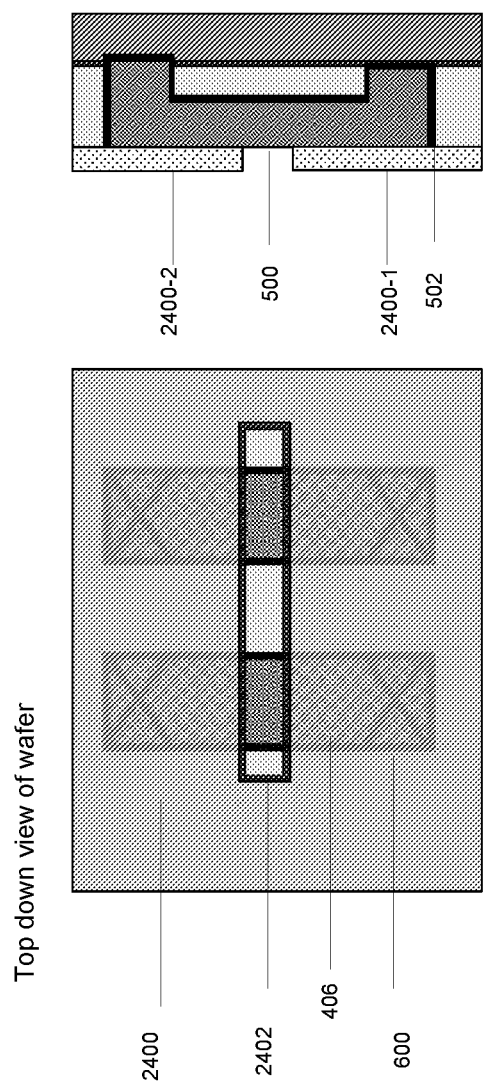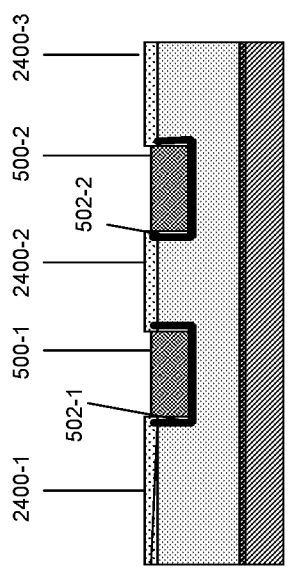

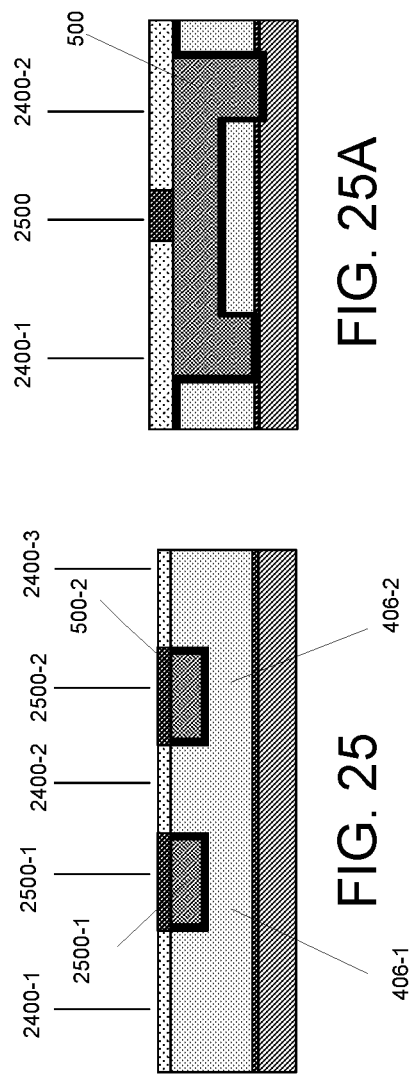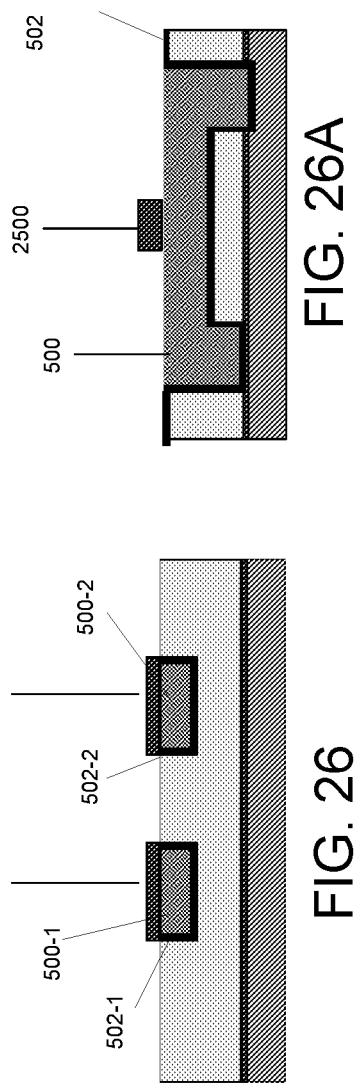

FORMING BARRIER WALLS, CAPPING, OR ALLOYS /COMPOUNDS WITHIN METAL LINES

BACKGROUND

In integrated circuit chip fabrication, continuous scaling of all interconnect components has necessitated the use of thinner diffusion barriers and higher densities of smaller critical dimension (CD) lines.

The flux of electrons flowing through metal lines in interconnects causes ions to move in a preferential direction leading to voids (opens) and extrusions (shorts). This phenomenon has been termed Electromigration (EM). Electromigration is tied to a number of process steps in backend interconnects. Methods to limit electromigration have been to slow diffusion, impede nucleation, and restricting design rules to damage resistant designs.

Metal line reliability, specifically electromigration, degrades as the length of the lines increases. This may severely restricts the choice of conducting material, diffusion barrier thickness, and length of lines from which the circuit designers may choose.

BRIEF DESCRIPTION OF THE DRAWINGS

FIG. 4A to FIG. 4E are diagrams illustrating an example of self-aligned VIA patterning process.

FIG. 6 illustrating an example of top down view of the wafer.

FIG. 6A illustrating an example of cross section perpendicular to trenches.

FIG. 6B illustrating an example of cross section parallel to trenches and VIAs.

FIG. 7 illustrating an example of top down view of the wafer.

FIG. 7A illustrating an example of cross section perpendicular to trenches.

FIG. 7B illustrating an example of cross section parallel to trenches and VIAs.

FIG. 8 illustrating an example of cross section perpendicular to trenches.

FIG. 8A illustrating an example of cross section parallel to trenches and VIAs.

FIG. 9 illustrating an example of cross section perpendicular to trenches.

FIG. 9A illustrating an example of cross section parallel to trenches and VIAs.

FIG. 12 illustrating an example of top down view of the wafer.

FIG. 12A illustrating an example of cross section perpendicular to trenches.

FIG. 12B illustrating an example of cross section parallel to trenches.

FIG. 13 illustrating an example of top down view of the wafer.

FIG. 13A illustrating an example of cross section perpendicular to trenches.

FIG. 13B illustrating an example of cross section parallel to trenches.

FIG. 14 illustrating an example of cross section perpendicular to trenches.

FIG. 14A illustrating an example of cross section parallel to trenches.

FIG. 15 illustrating an example of cross section perpendicular to trenches.

FIG. 15A illustrating an example of cross section parallel to trenches.

FIG. 16 illustrating an example of cross section perpendicular to trenches.

FIG. 16A illustrating an example of cross section parallel to trenches.

FIG. 17 illustrating an example of cross section perpendicular to trenches.

FIG. 17A illustrating an example of cross section parallel to trenches.

FIG. 18 illustrating an example of cross section perpendicular to trenches.

FIG. 18A illustrating an example of cross section parallel to trenches.

FIG. 19 illustrating an example of cross section perpendicular to trenches.

FIG. 19A illustrating an example of cross section parallel to trenches.

FIG. 23 to FIG. 28 illustrating an example of process of capping and alloy/compound (treating of Cu).

FIG. 23 illustrating an example of top down view of the wafer.

FIG. 23A illustrating an example of cross section perpendicular to trenches.

FIG. 23B illustrating an example of cross section parallel to trenches and VIAs.

FIG. 24 illustrating an example of cross section perpendicular to trenches.

FIG. 24A illustrating an example of cross section parallel to trenches and VIAs.

FIG. 24B illustrating an example of cross section (side view) parallel to trenches and VIAs.

FIG. 25 illustrating an example of cross section perpendicular to trenches.

FIG. 25A illustrating an example of cross section parallel to trenches and VIAs.

FIG. 26 illustrating an example of cross section perpendicular to trenches.

FIG. 26A illustrating an example of cross section parallel to trenches and VIAs.

FIG. 27 illustrating an example of cross section perpendicular to trenches.

FIG. 28 illustrating an example of cross section perpendicular to trenches.

DETAILED DESCRIPTION

Figure 1:
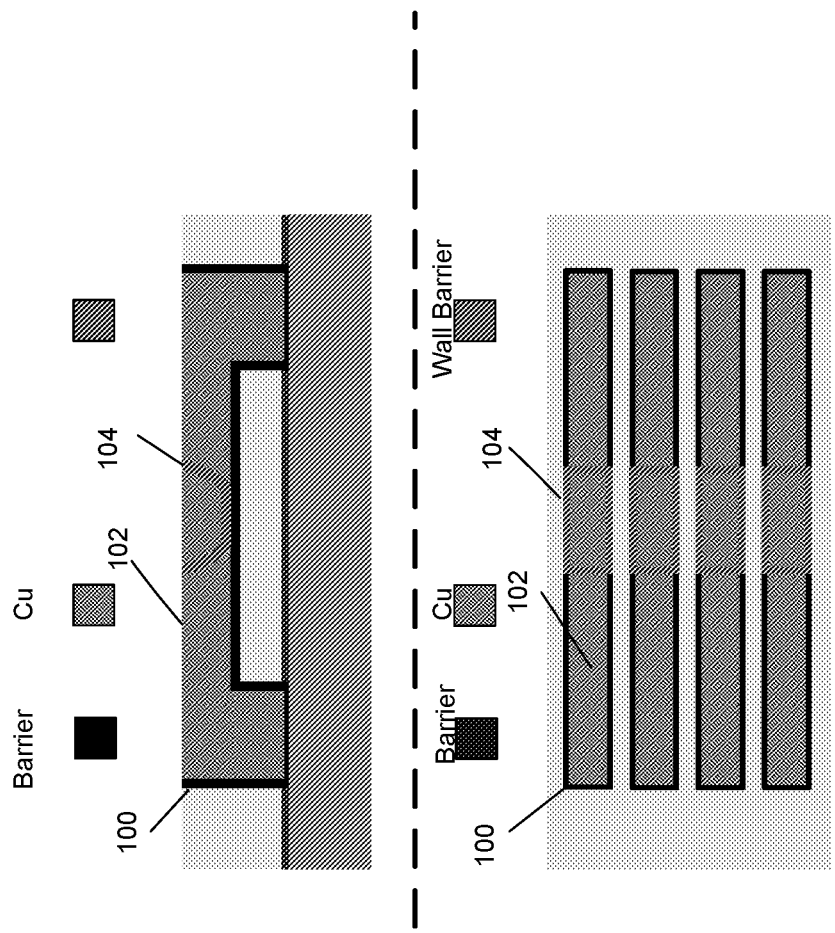
FIG. 1 is a diagram illustrating an example of an Integrated Circuit containing top down and cross sectional views containing the wall barrier.

This document discloses structures and methods of forming barrier walls, capping, or alloys/compounds (treating copper so that an alloy or compound is formed) to reduce electromigration (EM) and strengthen metal reliability which degrades as the length of the lines increases in integrated circuits. The term Blech effect (short lines rule) quantifies the line length effect as a stress gradient builds due to electromigration.

In the following detailed description, reference is made to the accompanying drawings that show, by way of illustration, specific embodiments in which the invention may be practiced. These embodiments are described in sufficient detail to enable those skilled in the art practice of the invention. It is to be understood that the various embodiments of the invention, although different are not necessarily mutually exclusives. For example, a particular feature, structure, or characteristic described herein, in connection with one embodiment, may be implemented within other embodiments without departing from the spirit and scope of the invention. In addition, it is to be understood that the location or arrangement of individual elements within one disclosed embodiment may be modified without departing from the spirit and scope of the invention. The following detailed description is, therefore, not taken in limiting sense, and the scope of the present invention is defined only by the appended claims, appropriately interpreted, along with the full range of equivalents to which claims are entitled. In the drawings, like numerals refer to the same or similar functionality throughout the several views.

Methods and associated structures of forming barrier walls, capping, or alloys/compounds are described. These methods may include depositing a dielectric layer, patterning the dielectric layer by lithography (e.g. photolithography) and etching the pattern using wet or dry etching such as reactive ion etching, RIE, and depositing a metal layer that fills the trench in the dielectric layer. Then excess metal is removed by Chemical Mechanical Polishing (CMP). CMP is a process of smoothing surfaces with the combination of chemical and mechanical forces. It is also a process that is used for the planarization of semiconductor wafers.

FIG. 1 illustrates a method, forming of a barrier wall and structure includes a field barrier 100, Copper (Cu) 102 and a wall barrier 104, where the barrier wall 104 is deposited within the backend structures orthogonal to the metal interconnect (or metal line) direction forming a wall within the metal line that stops the flow of the metal conductor atoms. Essentially the Blech short line effect is achieved in long metal lines by segmenting them into multiple short metal lines. This is especially useful in increasing the reliability of the transmission grid where the lines may need to be very long. Using such process would enable designers to use any length line at any metal level without breaking EM design rules.

Figure 2:
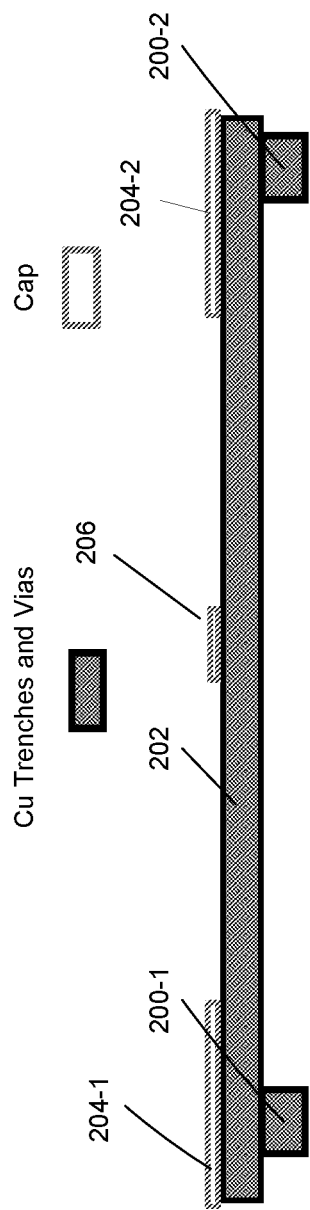
FIG. 2 is a diagram illustrating an example of an Integrated Circuit containing short barrier caps at vertical interconnect access (VIAs) and on top of lines intermittently along dominant diffusion path.

FIG. 2 illustrates a method of capping and a structure that includes trenches and VIAs (Vertical Inter-connect Access) 200, Cu 202, and cap 204. In this process, there is an intermittent cap 206 deposited along the top of the metal interconnects (or metal lines), as shown in FIG. 2, to slow diffusion at end caps, VIAs, and intermittently along metal lines (e.g. from 200 nm-5 um apart) which are not utilizing the Blech effect but alternatively slows the dominant diffusion path for Cu at trench tops.

Figure 3:
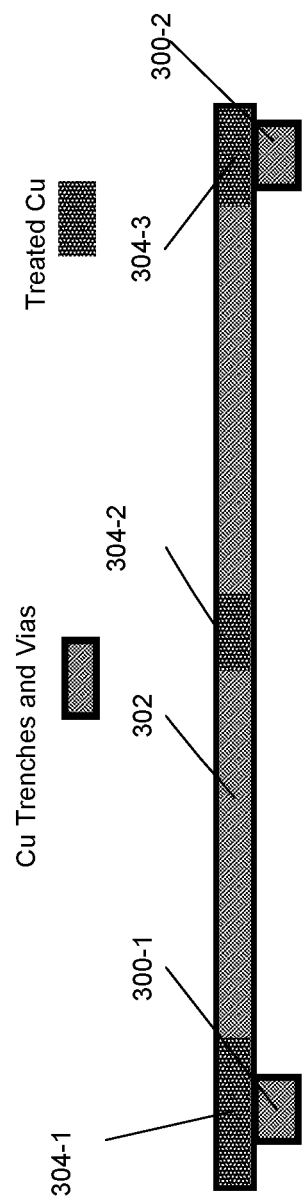
FIG. 3 is a diagram illustrating an example of an Integrated Circuit containing treated Cu.

FIG. 3 illustrates a method, of treating Cu to form an alloy/compound and a structure that includes trenches and VIAs 300, Cu 302, and treated Cu 304. In this process, short sections of the metal interconnects (or metal lines) are subjected to treatment that forms alloys/compounds 304 at the top or within the metal lines, the metal lines at end caps, VIAs, and intermittently along metal lines, may significantly slows the dominant diffusion paths for Cu within trenches. The treatment alters the Cu in patterned backend interconnect structures orthogonal to the metal line direction forming a wall within the metal line 304 that stops the flow of the metal conductor ions. Essentially when the wall is fully formed, the Blech short line effect is achieved in long lines by segmenting them into multiple short lines. When the top portion or part of the way through the line contains the alloy/compound, it slows the dominant diffusion path for electromigration. This is especially useful in increasing the reliability of the transmission grid where the lines may need to be very long.

FIGS. 4A to 4E illustrates the process done in SAV (Self-aligned Via) patterning, the figure shows the etch stop (ES) 400, the inter-layer dielectric (ILD) 402, TiN hard mask (HM) 404, the trenches 406 and the carbon hard mask (CHM) 408.

FIGS. 5A to 5D, illustrates the process done in SAV patterning and gap fill, as done in prior art, wherein VIAs are patterned and etched, photoresist, CHM, and HM are removed by wet cleans, the first barrier layer and Cu is deposited and polish with chemical mechanical polishing (CMP). In the first method, forming of barrier wall FIG. 1, there are two processes, the first process starts at post CMP.

The etch stop (ES) layer 400 includes materials such as, but not limited to, silicon nitride (SiN), silicon oxide (SiO), silicon carbide (SiC), oxynitride or combination thereof. ILD 402, a dielectric material with low-k dielectric, used to electrically separate closely spaced interconnect lines arranged in several levels (or multiple metallization) in advanced integrated circuits, includes materials such as, but not limited to, silicon dioxide ($SiO_2$), silicon monoxide (SiO), carbon doped oxide or combination thereof.

Figures 5A, 5B, 5C, 5D:
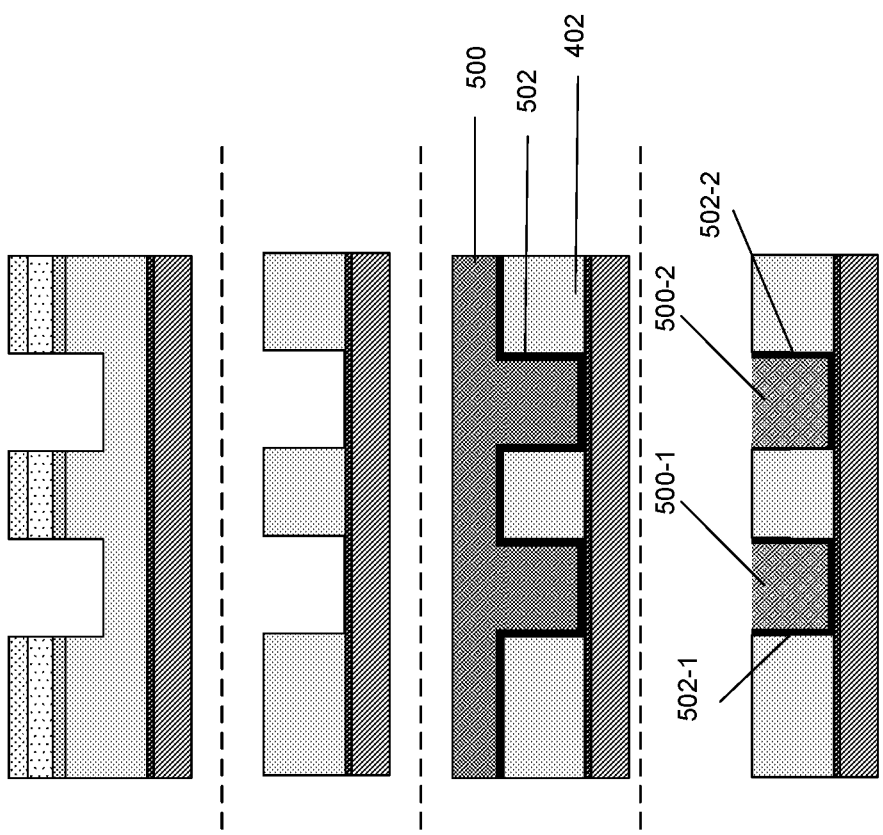
FIG. 5A to FIG. 5D are diagrams illustrating an example of self-aligned VIA patterning and gap fill process.

FIG. 6 shows a top down view of a wafer with the location of the Vertical Interconnect Access (VIA) 600 and the trenches 406 of a SAV flow processed metal x layer from FIG. 5D. FIG. 6A shows a cross section perpendicular to trenches 406 (no VIAs in this section) with Cu 500 deposited with the barrier layer 502 refer to FIG. 5C, after CMP, refer to FIG. 5D, the Cu 500 inside the trenches and barrier layer 502 formed only in the sidewalls and bottom surfaces of the trenches 406 remains. FIG. 6B shows a cross section parallel to trenches 406 and VIAs 600 with Cu 500 deposited and the field barrier 502 formed only in the sidewalls and bottom surfaces of the trenches 406 and VIAs 600. CMP technique is known to one of ordinary skill in the art of chip fabrication.

FIG. 7 shows a top view of the wafer, the wafer is covered with photoresist 700 by spin coating, for example. Low resolution (248 nm or 193 dry) lithography (e.g., photolithography) defines sections in portions of lines 702, the VIAs 600 and the trenches 406. It shows that critical dimension is self-aligned by metal lines. The other dimension tolerance may be on the order of 100's of nm. Mask of short lines within metal lines are designed so that they do not overlap with the locations of VIAs 600. FIG. 7A shows the cross section perpendicular to trenches 406 includes photoresist 700 on top surface of ILD 402, the Cu 500 in the trenches 406 and the barrier layer 502 in the sidewalls and the bottom of the trenches and FIG. 7B shows cross section parallel to trenches 406 and VIAs 600, also shows the photoresist 700. Lithography is a process used to transfer pattern from the mask to the layer of resist deposited on the surface of the wafer. Lithography techniques may include photolithography, electron beam lithography, X-ray lithography, or any other technique known to one of ordinary skill in the art of chip fabrication. Photoresist applications are also well known in the art of chip fabrication.

FIG. 8 shows the cross section perpendicular to trenches 406 and FIG. 8A shows the cross section parallel to trenches 406 and VIAs 600. In this process, using controlled copper recess or CCR wet etch, a selective Cu 500 recess is removed to open up the lithographically defined portion of trenches 406 (see FIG. 8) and undercut the exposed pattern into the material Cu 500 underneath the photoresist 700, where the undercut pattern is equivalent to the depth of the line (see FIG. 8A). The distance of undercutting is called bias. Etchants with large bias are called isotropic, because they erode the substrate equally in all directions. The substrate in this embodiment is Cu. Therefore, isotropic Cu 800 is formed (see FIG. 8A). Patterning and etching of the photoresist may be performed using one of the techniques known to one of ordinary skill in the art of chip fabrication.

FIG. 9 shows the cross section perpendicular to trenches 406 and FIG. 9A shows the cross section parallel to trenches 406 and VIAs 600. In this process the photoresist 700, (e.g., FIG. 8 and FIG. 8A), is removed with wet cleans (see FIG. 9), and expose the open portion of the isotropic Cu 800 (see FIG. 9A). Wet cleans use combination of acids, solvents, surfactants, and deionized water to dissolve, oxidize, etch, and scrub contaminants from the wafer surface. Wet cleaning sequence is always completed with carefully executed wafer drying process. Wet cleans may be performed using one of the techniques known by one skilled in the art of chip fabrication.

Figure 10A:
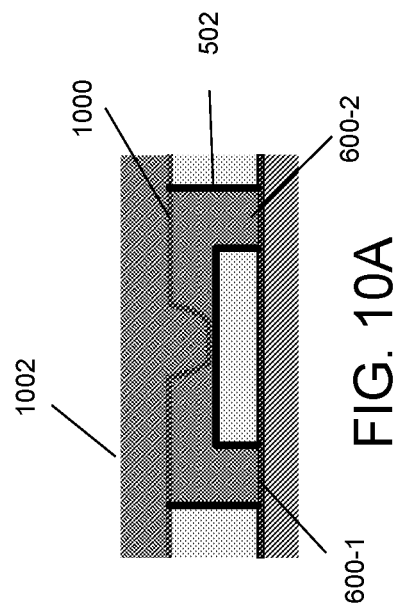
FIG. 10A illustrating an example of cross section parallel to trenches and VIAs.
Figure 10:
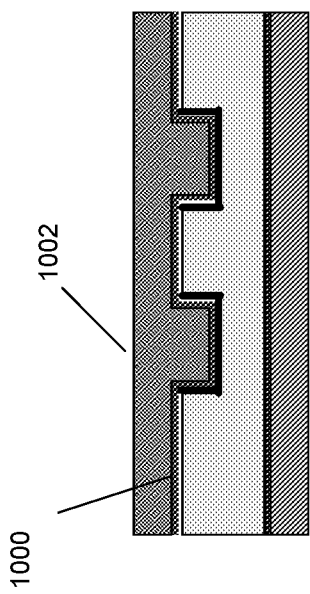
FIG. 10 illustrating an example of cross section perpendicular to trenches.

FIG. 10 shows the cross section perpendicular to trenches 406 and FIG. 10A shows cross section parallel to trenches 406 and VIAs 600. In this process a second barrier seed layer is deposited in the metal line as barrier wall 1000 (a barrier wall may be Tantalum (Ta) based, Ruthenium (Ru), or Ruthenium alloy with thickness from 1-10 nm), the deposition may be implemented through Chemical Vapor Deposition (CVD) or using any suitable deposition techniques. Then the metal fill Copper, Cu 1002 may also be implemented through CVD or any suitable deposition technique. Other deposition techniques are PVD, ALD, Electroless, EP, may be performed by one skilled in the art of chip fabrication.

Figure 11A:
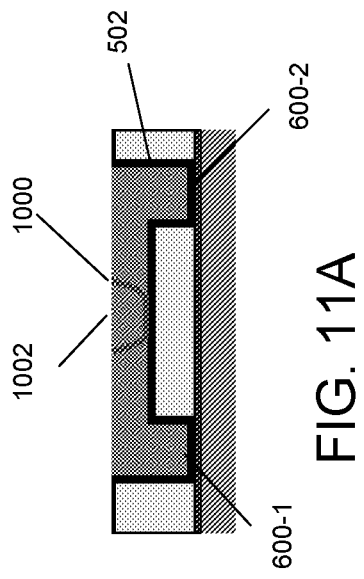
FIG. 11A illustrating an example of cross section parallel to trenches and VIAs.
Figure 11:
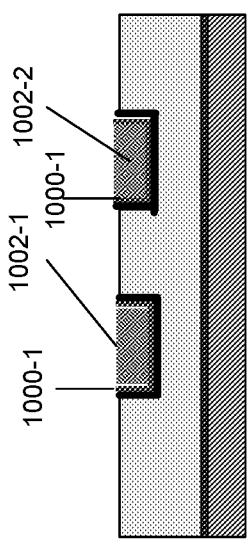
FIG. 11 illustrating an example of cross section perpendicular to trenches.

FIG. 11 shows the cross section perpendicular to trenches 406 and FIG. 11A shows the cross section parallel to trenches 406 and VIAs 600. CMP process is performed to remove or polish excess Cu 1002 leaving fully patterned metal lines with barrier walls Ru 1000 present within metal lines and the trenches is filled with Cu 1002. Only the barrier wall Ru 1000 and barrier layer 502 in the sidewalls and bottom surfaces in trenches 406 remains, the barrier wall Ru 1000 from the top surface were removed during CMP (see FIG. 11). In FIG. 11A, in the VIAs 600 only the field barrier 502 in the sidewalls and bottom surfaces and the barrier wall Ru 1000 in the isotropic Cu 800 remains and the barrier wall Ru 1000 from the top surface were removed during CMP. The process ends after completing the CMP process, the barrier wall Ru 1000 has been defined as a result.

The second process of forming barrier wall starts at post patterning of trenches and CHM deposition. FIG. 12 shows a top down view of a SAV flow processed metal x layer from FIG. 4E, includes CHM 408. FIG. 12A, shows a cross section perpendicular to trenches 406 (no VIAs at this point), includes ES 400, on top surface is ILD 402, HM 404 and the deposited CHM 408, refer to FIG. 4E. FIG. 12B shows a cross section parallel to trenches 406.

FIG. 13 shows the top down view of a wafer. The wafer is covered with a photoresist 1300 by spin coating, for example. The structure shows the CHM 408 is on top surface of HM 404 and photoresist 1300 is on top surface of CHM 408 (e.g., FIG. 13A and FIG. 13B). Low resolution (248 nm or 193 dry) lithography defines sections in portions of lines 1302. Top down shows that critical dimension is self-aligned by remaining HM 404. The other dimension tolerance may be on the order of 100's of nm. Mask of short lines within metal lines 1302 are designed so that they do not overlap with locations of VIAs and therefore there is no need for breakthrough of barrier material. FIG. 13A shows the cross sectional view perpendicular to trenches 406 and the portion 1306 where the photoresist 1300 is not applied. FIG. 13B shows the cross section parallel to trenches 406 (no VIAs at this point). Photoresist application is a known to one ordinary skill in the art of chip fabrication.

FIG. 14 shows the cross section perpendicular to trenches 406 and FIG. 14A shows the cross section parallel to trenches 406. In this process the CHM 408 is removed from the portion of trenches 406 that have been defined and patterned by low resolution lithography refer to FIG. 13, using any suitable etching techniques such as wet or dry etching, or RIE. At the end of this process the photoresist 1300 is removed with select wet cleans, (e.g., FIG. 13A and FIG. 13B). FIGS. 14 and 14A shows the remaining CHM 408, the trenches 406, the exposed HM 404, and ILD 402. Patterning and etching of the photoresist and CHM is a known skilled in the art of chip fabrication. Wet cleans use combination of acids, solvents, surfactants, and deionized water to dissolve, oxidize, etch, and scrub contaminants from the wafer surface. Wet cleaning sequence is always completed with carefully executed wafer drying process. Wet cleans may be performed using one of the techniques known by one skilled in the art of chip fabrication.

FIG. 15 shows the cross section perpendicular to trenches 406 and FIG. 15A shows the cross section parallel to trenches 406 (no VIAs at this point). In this process a barrier wall 1500 is now deposited in the metal line using any suitable deposition techniques (e.g., CVD, PVD, ALD or EP), on top of the remaining CHM 408, the exposed HM 404 and in the trenches 406. The barrier wall 1500 can be Ta based, Ruthenium, Ru or other materials with diffusion barrier properties and with thickness from 0.1 nm-10 nm. A Ruthenium (Ru) layer is used in this example. A Ruthenium or Ruthenium alloy layer may not appreciably affect line resistance.

FIG. 16 shows the cross section perpendicular to trenches 406 and FIG. 16A shows the cross section parallel to trenches 406 (no VIAs at this point). In this process CHM2

1600 is deposited on top of conformal Ruthenium layer (barrier wall) 1500 using any suitable deposition technique (e.g., CVD, PVD, ALD or EP), and also shows the CHM 408 deposited earlier in the process, refer to FIG. 15 and FIG. 15A.

FIG. 17 shows the cross section perpendicular to trenches 406 and FIG. 17A shows the cross section parallel to trenches 406 (no VIAs at this point). In this process CHM2 1600, barrier wall Ru 1500 top surface, and CHM 408 are removed by CMP until HM 404 is reached, (e.g., FIG. 16 and FIG. 16A). Only the barrier wall Ru 1500 formed in the sidewalls and the bottom surface on the trenches 406 may remain. CMP technique is known to one of ordinary skill in the art of chip fabrication.

A planar CHM 1800 is deposited using any suitable deposition technique such as spun on for example. FIG. 18 shows the cross section perpendicular to trenches 406 at VIA location 600, refer to FIG. 6. No barrier wall present in VIA location FIG. 18, the structure includes HM 404, planar CHM 1800 on top surface of ILD 402 and FIG. 18A shows the cross section parallel to trenches 406, barrier wall Ru 1500 which is present every 1-2 μm along metal line, the CHM 1800 on top surface of ILD 402. At this point the structure is similar to pre wall processing and is sent on to VIA patterning, (e.g., FIG. 5A to FIG. 5D). VIAs are formed in areas that were unaffected by patterning, i.e. barrier walls were not formed near VIAs. VIA patterning is known to one ordinary skill in the art of chip fabrication.

FIG. 19 shows the cross section perpendicular to trenches 406 at VIA location 1902 and FIG. 19A shows the cross section parallel to trenches 406 and the barrier wall 1500. In this process, photoresist layer 1900 and planar CHM layer 1800 are patterned and etch to form openings, such as the VIAs 1902. VIAs are made through dielectric to connect lower metal with higher metal. Patterning and etching of the photoresist and CHM is known to one of ordinary skill in the art of chip fabrication.

Figure 20A:
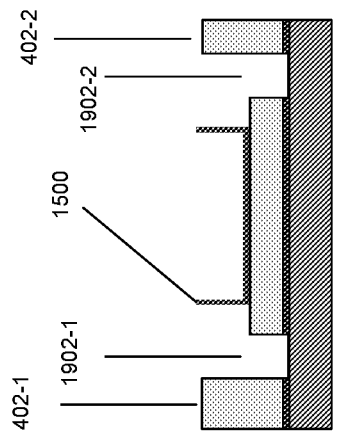
FIG. 20A illustrating an example of cross section parallel to trenches.
Figure 20:
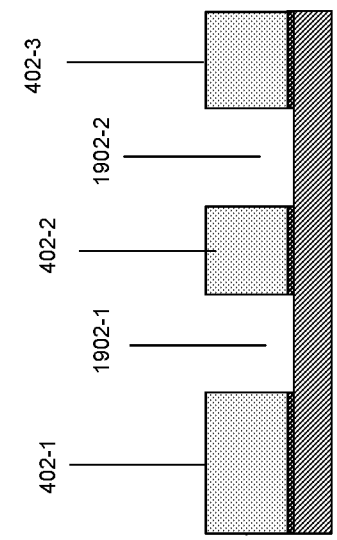
FIG. 20 illustrating an example of cross section perpendicular to trenches.

FIG. 20 shows the cross section perpendicular to trenches 406 at VIA location 1902 and FIG. 20A shows the cross section parallel to trenches 406, the barrier wall Ru 1500. In this process, selective wet cleans are used to remove the planar CHM 1800, photoresist 1900, and HM 404 (e.g. FIG. 19 and FIG. 19A). Barrier wall Ru 1500 is retained. Wet cleans use combination of acids, solvents, surfactants, and deionized water to dissolve, oxidize, etch, and scrub contaminants from the wafer surface. Wet cleaning sequence is always completed with carefully executed wafer drying process. Wet cleans may be performed using one of the techniques known to one ordinary skill in the art of chip fabrication. At this point the structure is ready for metallization.

Figure 21A:
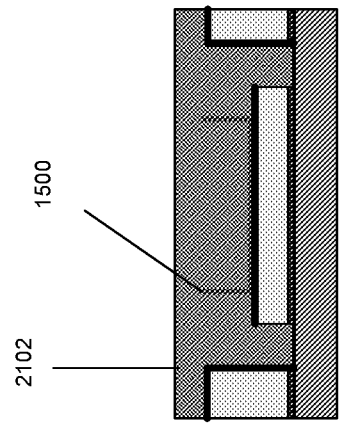
FIG. 21A illustrating an example of cross section parallel to trenches.
Figure 21:
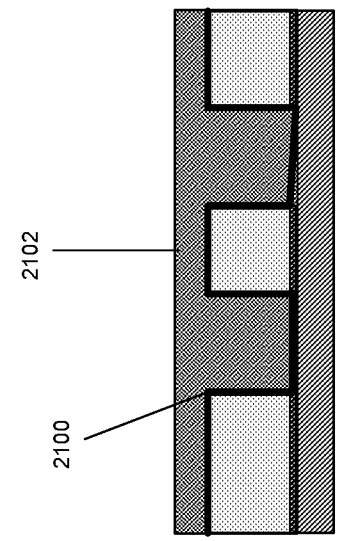
FIG. 21 illustrating an example of cross section perpendicular to trenches.

FIG. 21 shows the cross section perpendicular to trenches 406 at VIA location 1902 and FIG. 21A shows the cross section parallel to trenches 406 and the barrier wall 1500. In this process, a barrier layer 2100 of Titanium Nitride (TiN), Tantalum Nitride (TaN), Tungsten Nitride (WN), Ruthenium (Ru), Ruthenium alloy, other materials with diffusion barrier properties, or combination thereof, is deposited in the VIA location 1902 (e.g., FIG. 20 and FIG. 20A), and a conductive layer Cu 2102, for example, is deposited in the metal line using any suitable deposition technique (e.g., CVD, PVD, ALD or EP) for gap fill, (e.g., FIG. 20 and FIG. 20A). Metal deposition technique is a known to one ordinary skill in the art of chip fabrication.

Figure 22A:
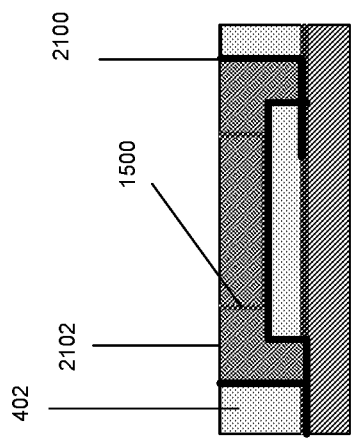
FIG. 22A illustrating an example of cross section parallel to trenches.
Figure 22:
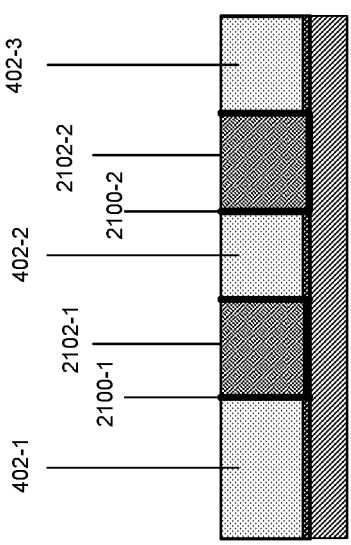
FIG. 22 illustrating an example of cross section perpendicular to trenches.

FIG. 22 shows the cross section perpendicular to trenches 406 at VIA location 1902 and FIG. 22A shows the cross section parallel to trenches 406. CMP process is performed to remove or polish excess Cu 2102 and the barrier layer 2100 on the surface of the ILD 402 (e.g., FIG. 21 and FIG. 21A), only the barrier layer 2100 in the sidewalls and bottom surface of the VIAs 1902 remains FIG. 22. In FIG. 22A, only the barrier layer 2100 in the sidewalls and bottom surface in trenches 406 remains, leaving fully patterned metal lines with barrier walls Ru 1500 present within metal lines and the trenches filled with Cu 2102. The process ends after completing the CMP process, the barrier wall Ru 1500 has been defined as a result.

FIG. 23 shows a top down view of a wafer after CMP, FIG. 5D. FIG. 23A shows a cross section perpendicular to trenches 406 that includes Cu 500, barrier layer 502, ILD 402, and ES 400. FIG. 22B shows a cross section parallel to trenches 406 and VIAs 600.

FIG. 24 shows the top down view of the wafer. The wafer is covered with photoresist 2400 by spin coating, for example. Low resolution (248 nm or 193 dry) lithography defines sections in portions of lines 2402. Top down shows that critical dimension is self-aligned by metal lines. The other dimension tolerance may be on the order of 100's of nm. Mask of short lines within metal lines 2402 are designed so that they open up VIAs and about 1-2 um along the metal lines (not shown). FIG. 24A shows the cross section perpendicular to trenches 506, the photoresist 2400 on top of the surface of ILD 402, barrier layer 502 in the sidewalls and the bottom surface of the trenches 406 filled with Cu 500. FIG. 24B shows the cross section parallel to trenches 406 and VIAs 600, that includes the photoresist on top surface of ILD 402 and portion of the trenches 406 and VIAs 600 and the Cu 500 on the trenches 406 and VIAs 600, also the barrier layer 502 in the sidewalls and the surface bottom of the trenches 406 and VIAs 600.

FIG. 25 shows the cross section perpendicular to trenches 406 and FIG. 25A shows the cross section parallel to trenches 406 and VIAs 600. An intermittent cap (selective metal cap) 2500 deposited along the top of the metal lines to slow diffusion at end caps, VIAs, and intermittently along metal lines, using any suitable deposition technique (e.g., CVD, PVD, ALD, electro less or EP). Material can be, but not limited to, Cobalt Tungsten Boron (CoWB), Cobalt Tungsten Phosphorous (CoWP), for example.

FIG. 26 shows the cross section perpendicular to trenches 406 and FIG. 26A shows the cross section parallel to trenches 406 and VIAs 600. In this process, the photoresist 2400 is removed with wet cleans. Wet cleans may be performed using one of the techniques known by one skilled in the art of chip fabrication.

Figure 27A:
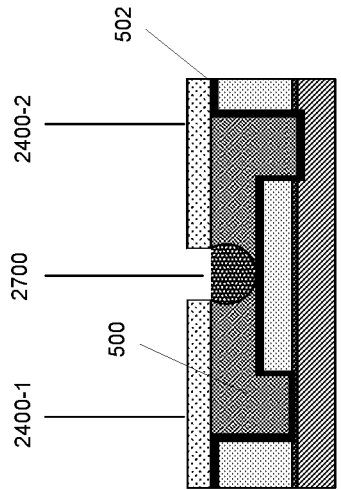
FIG. 27A illustrating an example of cross section parallel to trenches and VIAs.
Figure 27:
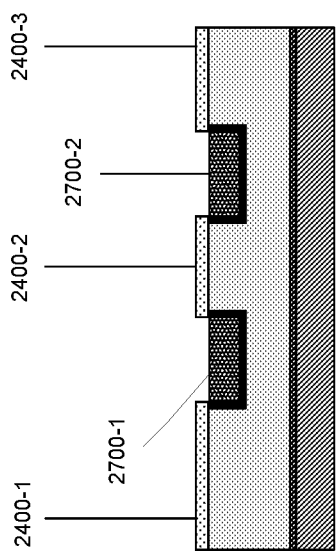

FIG. 27 shows the cross section perpendicular to trenches 406 and FIG. 27A shows the cross section parallel to trenches 406 and VIAs 600. In this process, a selective Cu 500 recess is treated to form a diffusion barrier 2700 at the top or within metal lines, (e.g., FIG. 27 and FIG. 27A). A treated Cu 2700, for example, with SiH$_3$ or GeH$_4$ at 100 deg. Celsius to 400 deg. Celsius would form an alloys/compounds, Silicides or Germanides at the top or within the metal line. FIG. 27 shows the cross section perpendicular to trenches 406 and FIG. 27A shows the cross section parallel to trenches 406 and VIAs 600.

Figure 28A:
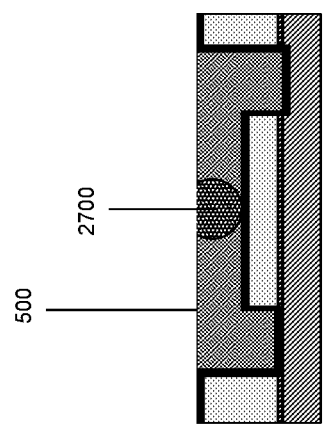
FIG. 28A illustrating an example of cross section parallel to trenches and VIAs.
Figure 28:
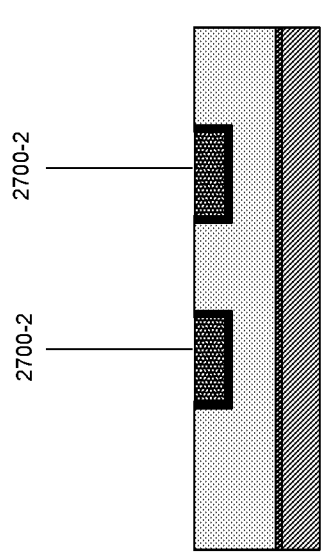

FIG. 28 shows the cross section perpendicular to trenches 406 and FIG. 28A shows the cross section parallel to trenches 406 and VIAs 600. In this process the photoresist 2400 is removed with wet cleans, (e.g., FIG. 278 and FIG. 27A). Wet cleans may be performed using one of the techniques known by one skilled in the art of chip fabrication.

Figure 29:
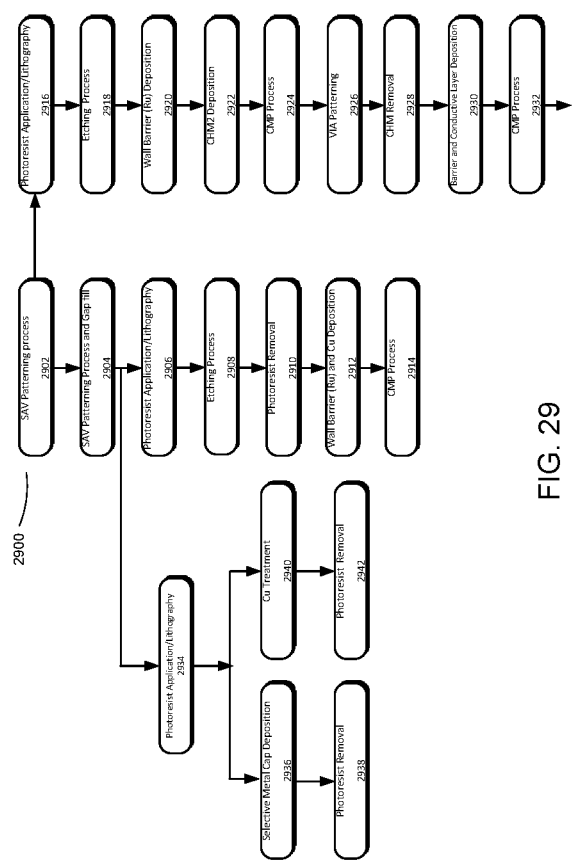
FIG. 29 is a block diagram of methods of forming barrier walls, capping, and alloy/compound (treating of Copper, Cu) within metal lines.

FIG. 29 shows block diagram 2900 of methods of forming barrier walls, capping, or alloys/compounds.

At block 2904, the first process of forming of a barrier wall, starts at post CMP. A chemical mechanical polishing or CMP process is performed to remove or polish excess Cu and barrier layer from the structure.

At block 2906, a wafer is covered with photoresist by spin coating. Low resolution lithography defines sections in portions of lines. Mask of short lines within lines are designed so that they do not overlap with the locations of VIAs.

At block 2908, using CCR wet etch (patent # P38630PCT), a selective Cu recess is removed to open up the lithographically define portion of trenches and undercut the exposed pattern into the material Cu underneath the photoresist.

At block 2910, the photoresist is removed with wet cleans.

At block 2912, barrier wall, Ru, for example, is deposited and the metal fill, Cu is also deposited using any suitable deposition technique (e.g., CVD, PVD, ALD, electro less or EP).

At block 2914, CMP process is performed to remove or polish excess Cu, leaving fully patterned metal lines with barrier walls present within metal lines. And it is now ready for the next layer of metallization.

At block 2902, the second process of forming of barrier walls, starts at the post patterning of trenches and CHM deposition.

At block 2916, a wafer is covered with photoresist by spin coating. Low resolution lithography defines sections in portions of lines. Mask of short lines within lines are designed so that they do not overlap with location of VIAs.

At block 2918, CHM is removed from the portion of trenches that have been defined and patterned by low resolution lithography process, using any suitable etching techniques such as wet or dry etching, for example, or RIE. The photoresist is removed with select wet cleans.

At block 2920, a barrier wall is deposited in the metal line using any suitable deposition technique (e.g., CVD, PVD, ALD, electro less or EP). Barrier wall can be Ta based, Ruthenium or other. A Ruthenium or Ruthenium alloy layer will not affect line resistance.

At block 2922, CHM2 is deposited into trenches and on top of conformal Ruthenium layer or the barrier wall Ru, using any suitable deposition technique (e.g., CVD, PVD, ALD, electro less or EP).

At block 2924, CHM2, barrier wall Ru top surface, and CHM are removed by CMP until HM is reached. Only the barrier wall Ru formed in the sidewalls and the bottom surface on the trenches remain.

At block 2926, VIAs are formed in areas that were unaffected by patterning i.e. barrier walls were not formed near VIAs. Also at this point, a planar CHM layer is deposited using any suitable deposition technique (e.g., CVD, PVD, ALD, electro less, spun, or EP). Photoresist layer and planar CHM layer are patterned or etched to form openings such as VIAs, using any suitable etching techniques such as wet or dry etching, or RIE.

At block 2928, planar CHM layer, photoresist, and HM are removed by selective wet cleans. Barrier wall Ru is retained on a substrate ILD.

At block 2930, a barrier layer Titanium Nitride (TiN), Tantalum Nitride (TaN), Tungsten Nitride (WN), Ruthenium (Ru), Ruthenium alloy, other materials with diffusion barrier properties, or combination thereof, is deposited in the VIA locations and conductive layer Cu is deposited for gap fill using any suitable deposition technique (e.g., CVD, PVD, ALD, electro less or EP).

At block 2932, CMP process is performed to remove or polish excess conductive layer Cu and the barrier layer TiN on the surface of the ILD. Only barrier layer in the sidewalls and bottom surface of the VIAs remain, leaving fully patterned metal lines with wall barrier Ru, present within metal lines and the trenches are filled with Cu. The process ends after completion of CMP process, the barrier wall Ru has been defined as a result.

At block 2934, a wafer is covered with photoresist by spin coating. Low resolution lithography defines sections in portions of lines. Mask of short lines within lines are designed so that they open up VIAs and about every 1-2 μm along the metal lines.

At block 2936, for the second method, capping, an intermittent cap (selective metal cap) deposited along the top of the metal lines to slow diffusion at end caps, VIAs, and intermittently along metal lines, by CVD or electro less or any deposition technique. Material can be, but not limited to, Cobalt Tungsten Boron (CoWB), Cobalt Tungsten Phosphorous (CoWP), for example.

At block 2938, the photoresist is removed with wet cleans.

At block 2940, for the third method, treating of Cu to form alloy/compound, a selective Cu recess is treated to form a diffusion barrier at the top or within metal lines. A diffusion barrier, for example, $SiH_3$ or $GeH_4$ at 100 deg. Celcius to 400 deg. Celcius may form an alloy/compound, Silicides or Gemanides at the top or within the metal line.

At block 2942, photoresist is removed with wet cleans.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the various configurations may be implemented as a combined structure or component. These and other variations, modifications, additions, and improvements may fall within the scope of the invention as defined in the claims that follow.

What is claimed is:

1. A structure comprising:
   a metal interconnect formed in a trenched layer of dielectric material of the structure, wherein the metal interconnect further includes:
   a vertical interconnect access (VIA) that is formed at each end of the metal interconnect;
   a barrier layer formed at least along upper surfaces of the vertical interconnect access (VIA) and the metal interconnect, wherein a conductive layer is deposited as gap fill in the barrier layer;
   a barrier wall formed on and above the barrier layer and within the metal interconnect, wherein the barrier wall is filled with a treated conductive layer to form a diffusion barrier.

2. The structure of claim 1, wherein the barrier wall is deposited within patterned backend structures orthogonal to a direction of the metal interconnect forming a wall within the metal interconnect that stops the flow of metal conductor ions.

3. The structure of claim 1, wherein the barrier wall is present every 1 to 2 micrometers (μm) along the metal interconnect.

4. The structure of claim 1, wherein the barrier wall deposited in an etch selective Cu recess forming an isotropic Cu.

5. The structure of claim 1, wherein the barrier wall is one of Tantalum (Ta), Ruthenium (Ru), Ru alloy, or materials with diffusion barrier properties, or combination thereof.

6. The structure of claim 1, wherein the barrier wall has thickness from 0.1 to 10 nanometers (nm).

7. The structure of claim 1, wherein the barrier layer is one of Titanium Nitride (TiN), Tantalum Nitride (TaN), Tungsten Nitride (WN), Tantalum Nitride (TaN), Tungsten Nitride (WN), Ruthenium (Ru), Ruthenium alloy, other materials with diffusion barrier properties, or a combination thereof.

8. The structure of claim 1 wherein the conductive layer is Copper (Cu).

9. The structure of claim 1 wherein a chemical mechanical polishing (CMP) process is performed to remove or polish excess conductive layer and the barrier layer on the surface of the layer of dielectric material.

10. A metal interconnect comprising:
   a trenched layer of dielectric material that includes a vertical interconnect access (VIA) that is formed at each end of the trenched layer;
   a barrier layer formed at least along upper surfaces of the vertical interconnect access (VIA) and the trenched layer, wherein a conductive layer is deposited as gap fill in the barrier layer; and
   a barrier wall formed on and above the barrier layer, wherein the barrier wall is filled with a treated conductive layer to form a diffusion barrier.

11. The metal interconnect of claim 10, wherein the barrier wall is deposited within patterned backend structures orthogonal to a direction of the metal interconnect forming a wall within the metal interconnect that stops the flow of metal conductor ions.

12. The metal interconnect of claim 10, wherein the barrier wall is not formed near the VIAs.

13. The metal interconnect of claim 10, wherein the barrier wall is present every 1 to 2 micrometers (μm) along the metal interconnect.

* * * * *